US011112818B2

United States Patent
Kim et al.

(10) Patent No.: US 11,112,818 B2
(45) Date of Patent: Sep. 7, 2021

(54) RECEPTION APPARATUS WITH CLOCK FAILURE RECOVERY AND TRANSMISSION SYSTEM INCLUDING THE SAME

(71) Applicant: MagnaChip Semiconductor, Ltd., Cheongju-si (KR)

(72) Inventors: Su Hyun Kim, Cheongju-si (KR); Sang Kyung Kim, Cheongju-si (KR); Gil Sung Roh, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 16/654,271

(22) Filed: Oct. 16, 2019

(65) Prior Publication Data
US 2020/0159280 A1 May 21, 2020

(30) Foreign Application Priority Data
Nov. 15, 2018 (KR) ........................ 10-2018-0140999

(51) Int. Cl.
*H03L 7/08* (2006.01)
*H03L 7/07* (2006.01)
*G06F 1/08* (2006.01)
*H03C 3/09* (2006.01)

(52) U.S. Cl.
CPC ............. *G06F 1/08* (2013.01); *H03C 3/0966* (2013.01); *H03L 7/07* (2013.01); *H03L 7/0802* (2013.01)

(58) Field of Classification Search
CPC ............ G06F 1/08; H03C 3/0966; H03L 7/07; H03L 7/0802
See application file for complete search history.

(56) References Cited

U.S. PATENT DOCUMENTS

| 2015/0160906 | A1 | 6/2015 | Hwang | |
| 2015/0262547 | A1* | 9/2015 | Higashino | G09G 5/006 345/58 |
| 2020/0304281 | A1* | 9/2020 | Takahashi | H04L 7/0079 |

FOREIGN PATENT DOCUMENTS

KR 10-2014-0054973 A 5/2014

\* cited by examiner

*Primary Examiner* — John W Poos
(74) *Attorney, Agent, or Firm* — NSIP Law

(57) ABSTRACT

A reception apparatus communicating with a transmission apparatus with a clock lane and a data lane. The reception apparatus comprises a clock lane control circuit configured to determine the operation mode of the clock lane based on a clock signal transmitted through the clock lane, and performing an operation based on the determined operation mode of the clock lane, and a data lane control circuit configured to determine the operation mode of the data lane based on a data signal transmitted from the transmission apparatus, and performing an operation based on the determined operation mode of the data lane, and the clock lane control circuit is configured to set the operation mode of the clock lane to a high-speed mode, when the operation mode of the data lane is switched from a low-power mode to the high-speed mode.

21 Claims, 10 Drawing Sheets

RECEPTION APPARATUS WITH CLOCK FAILURE RECOVERY AND TRANSMISSION SYSTEM INCLUDING THE SAME

CROSS-REFERENCE TO RELATED APPLICATION

This application claims the benefit under 35 USC § 119(a) of Korean Patent Application No. 10-2018-0140999, filed on Nov. 15, 2018 in the Korean Intellectual Property Office, the entire disclosure of which is incorporated herein by reference for all purposes.

BACKGROUND

1. Field

The following description relates to a reception apparatus with clock failure recovery and a transmission system including the reception apparatus.

2. Description of Related Art

In typical transmission systems, a transmission apparatus can transmit a clock signal and a data signal to a reception apparatus, and the reception apparatus can process the data signal by using the received clock signal. In transmission systems having two or more operation modes (e.g., a high-speed mode and a low-power mode), different clock signals may be used in each operation mode, and data processing may be adequately performed only when using an appropriate clock signal corresponding to each operation mode, such that it is important to use the appropriate clock signal based on the operation mode.

When the clock signal changes due to external noise, etc. so as not to be suitable for the corresponding operation mode (i.e., when the clock failure occurs), problems may occur in data processing.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a reception apparatus communication with a transmission apparatus includes a clock lane control circuit configured to determine an operation mode of a clock lane based on a clock signal transmitted through the clock lane, and perform an operation based on the determined operation mode of the clock lane; and a data lane control circuit configured to determine an operation mode of a data lane based on a data signal transmitted from the transmission apparatus, and perform an operation based on the determined operation mode of the data lane, wherein the clock lane control circuit is further configured to set the operation mode of the clock lane to a high-speed mode, when the operation mode of the data lane is switched from a low-power mode to the high-speed mode.

The data lane control circuit may be further configured to output a state signal indicating the operation mode of the data lane, and the clock lane control circuit may be further configured to set the operation mode of the clock lane to the high-speed mode in response to the state signal.

The clock lane control circuit may include a clock lane finite state machine (FSM) configured to control the operation mode of the clock lane, and wherein the clock lane FSM may be configured to switch the operation mode of the clock lane from the low-power mode to the high-speed mode, when a level of the clock signal indicates a high-speed mode entering sequence, and set the operation mode of the clock lane to the high-speed mode if the operation mode of the data lane is switched from the low-power mode to the high-speed mode, when the level of the clock signal does not indicate the high-speed mode entering sequence.

The data lane control circuit may include a data lane FSM configured to control the operation mode of the data lane, and wherein the data lane FSM is configured to monitor a level of the data signal, and generate a state signal indicating the operation mode of the data lane according to a result of the monitoring, and output the generated state signal to the clock lane FSM.

The clock lane control circuit may be further configured to generate a high-speed internal clock signal corresponding to the high-speed mode, and the data lane control circuit may be further configured to process the data signal by being synchronized to the high-speed internal clock signal, and generate the processed data signal.

The clock lane control circuit may be further configured to detect that the operation mode of the data lane is switched from the low-power mode to the high-speed mode, generate an interrupt signal based on a result of the detection, and set the operation mode of the clock lane to the high-speed mode in response to the generated interrupt signal.

The clock lane control circuit may be further configured to generate the interrupt signal while the data lane operates in the high-speed mode.

The clock lane control circuit may include a noise sensing circuit configured to detect external noise occurring on the clock lane, and the clock lane control circuit is further configured to determine whether the operation mode of the data lane is switched from the low-power mode to the high-speed mode, when the external noise is detected by the noise sensing circuit, and set the operation mode of the clock lane to the high-speed mode, when the operation mode of the data lane is switched from the low-power mode to the high-speed mode.

In a general aspect, a communication method between a reception apparatus and a transmission apparatus includes determining an operation mode of a clock lane based on a clock signal transmitted through the clock lane, and performing an operation based on the determined operation mode of the clock lane, determining an operation mode of the data lane based on a data signal transmitted from the transmission apparatus, and performing an operation based on the determined operation mode of the data lane; and setting the operation mode of the clock lane to a high-speed mode, when the operation mode of the data lane is switched from a low-power mode to the high-speed mode.

The setting the operation mode of the clock lane to the high-speed mode may include generating a state signal indicating the operation mode of the data lane; and setting the operation mode of the clock lane to the high-speed mode in response to the state signal.

The operating method may further include switching the operation mode of the clock lane from the low-power mode to the high-speed mode, when a level of the clock signal indicates a high-speed mode entering sequence; and setting the operation mode of the clock lane to the high-speed mode if the operation mode of the data lane is switched from the low-power mode to the high-speed mode, when the level of the clock signal does not indicate the high-speed mode entering sequence.

The method may further include generating a high-speed internal clock signal corresponding to the high-speed mode when the clock lane operates in the high-speed mode; and processing the data signal by being synchronized to the high-speed internal clock signal and generating the processed data signal.

The setting the operation mode of the clock lane to the high-speed mode may include detecting that the operation mode of the data lane is switched from the low-power mode to the high-speed mode, generating an interrupt signal based on a result of the detection; and setting the operation mode of the clock lane to the high-speed mode in response to the generated interrupt signal.

The generating the interrupt signal may include generating the interrupt signal while the data lane operates according to the high-speed mode.

The setting the operation mode of the clock lane to the high-speed mode may include detecting external noise occurring on the clock lane, determining whether the operation mode of the data lane is switched from the low-power mode to the high-speed mode, when the external noise has been detected; and setting the operation mode of the clock lane to the high-speed mode, when the operation mode of the data lane is switched to the high-speed mode.

In a general aspect, a transmission system includes a transmission apparatus, a reception apparatus; and a clock lane and at least one data lane connected between the transmission apparatus and the reception apparatus, wherein the clock lane and the at least one data lane are configured to operate based on any one mode of a low-power mode and a high-speed mode, respectively, wherein the reception apparatus includes a clock lane control circuit configured to determine an operation mode of the clock lane based on a clock signal transmitted through the clock lane, and perform an operation based on the determined operation mode of the clock lane; and a data lane control circuit configured to determine the operation mode of the at least one data lane based on a data signal transmitted from the transmission apparatus, and perform an operation based on the determined operation mode of the at least one data lane, and wherein the clock lane control circuit is further configured to set the operation mode of the clock lane to the high-speed mode, when the operation mode of the data lane is switched from the low-power mode to the high-speed mode.

The data lane control circuit may be further configured to output a state signal indicating the operation mode of the data lane, and the clock lane control circuit may be further configured to determine whether the operation mode of the data lane has been switched from the low-power mode to the high-speed mode based on the state signal, and set the operation mode of the clock lane to the high-speed mode based on a result of the determining.

The clock lane control circuit comprises a clock lane finite state machine (FSM) configured to control the operation mode of the clock lane, the data lane control circuit comprises a data lane FSM for controlling the operation mode of the data lane, wherein the data lane FSM is configured to monitor a level of the data signal, generate a state signal indicating the operation mode of the data lane based on a result of the monitoring, and output the generated state signal to the clock lane FSM, and wherein the clock lane FSM is configured to set the operation mode of the clock lane to the high-speed mode in response to the state signal.

The clock lane control circuit may be configured to detect that the operation mode of the data lane is switched from the low-power mode to the high-speed mode, generate an interrupt signal according to a result of the detection, and set the operation mode of the clock lane to the high-speed mode in response to the generated interrupt signal.

The clock lane control circuit may include a noise sensing circuit configured to detect external noise occurring on the clock lane, and the clock lane control circuit is further configured to determine whether the operation mode of the data lane is switched from the low-power mode to the high-speed mode, when the external noise is detected by the noise sensing circuit, and set the operation mode of the clock lane to the high-speed mode, when the operation mode of the data lane is switched from the low-power mode to the high-speed mode.

In a general aspect, an interface includes a transmission apparatus, a reception apparatus; and a clock lane and one or more data lanes configured to operate in one of a first mode and a second mode wherein an operation mode of the clock lane is set to the second mode when an operation mode of the one or more data lanes is switched from the first mode to the second mode.

The first mode may be a low-power mode and the second mode is a high-speed mode.

Other features and aspects will be apparent from the following detailed description, the drawings, and the claims.

Figure 1:
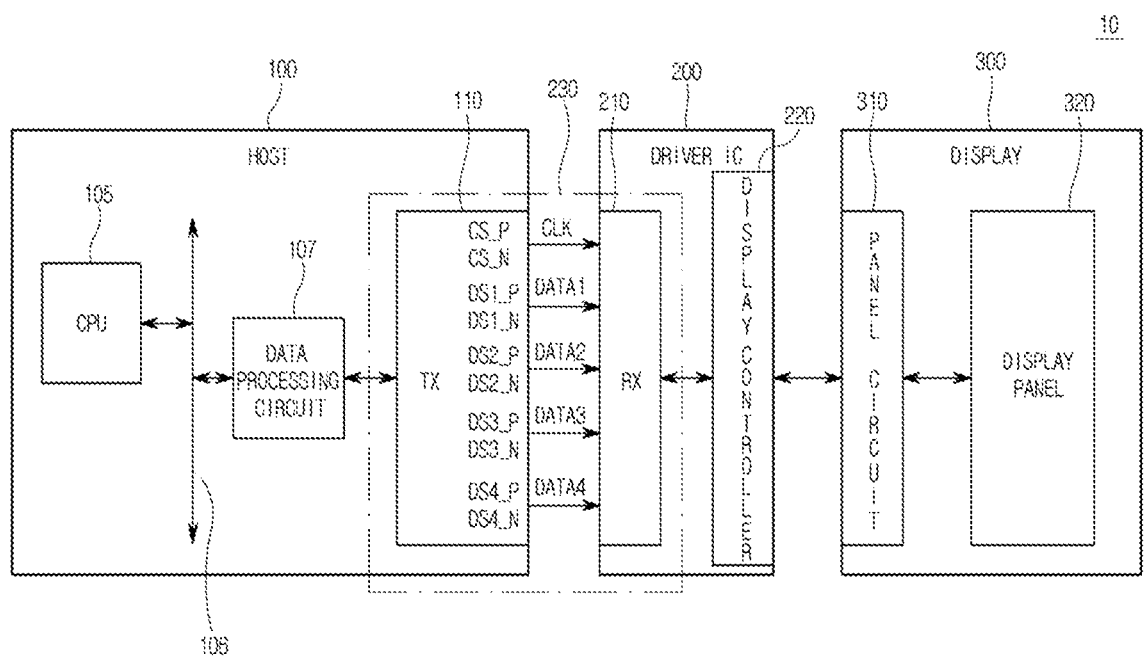
FIG. 1 is a diagram illustrating an example of a transmission system in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

FIG. 1 is a diagram illustrating an example of a transmission system.

Referring to FIG. 1, a transmission system 10 includes a host 100, a driver integrated circuit (IC) 200, and a display 300.

The transmission system 10 may be implemented as a mobile device that implements a mobile industry processor interface (MIPI) or a MIPI protocol. For example, the mobile device may be implemented as a mobile phone, a smart phone, a tablet PC, a personal digital assistant (PDA), an enterprise digital assistant (EDA), a digital still camera, a digital video camera, a portable multimedia player (PMP), a personal navigation device or a portable navigation device (PND), a mobile internet device (MID), or a wearable computer, etc. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The host 100 can control the operation of the driver IC 200. The host 100 and the driver IC 200 may communicate with each other through the MIPI interface 230. For example, the host 100 may be implemented as an integrated circuit, a system on chip (SoC), an application processor, or a mobile AP, but is not limited thereto.

The host 100 may include a CPU 105, a transmission apparatus (TX) 110, and a data processing circuit 107.

The CPU 105 can control the transmission apparatus 110 and/or the data processing circuit 107 through a bus 106. The CPU 105 may include one or more cores.

The transmission apparatus 110 may include one clock lane module and one or more data lane modules. The transmission apparatus 110 may transmit the clock signal (CS) and the data signals (DS1 to DS4) to a reception apparatus 210. Although only one clock lane module and four data lane modules are illustrated in FIG. 1, this is only an example, and the transmission apparatus 110 may include more than one clock lane module and more or less than four data lane modules.

The data processing circuit 107 may refer to a functional circuit that processes data (e.g., still image data, moving image data, or parameters) to be transmitted to the driver IC 200 through the transmission apparatus 110.

The driver IC 200 may include the reception apparatus 210 and a display controller 220. The driver IC 200 transmits the display data to the display 300. The driver IC 200 may be implemented as a chip.

The reception apparatus 210 may receive the clock signal (CS) and the data signals (DS1 to DS4) from the transmission apparatus 110. According to the examples, the reception apparatus 210 may be a slave apparatus that operates according to a control of the transmission apparatus 110.

The display controller 220 may transmit the line data (e.g., display data) to be output to the display 300.

The display controller 220 may output the processed data signals (DS_OUT1 to DS_OUT4) output from data lane control circuits 212 to 215 as discussed below with regard to FIG. 3. According to the examples, the display controller 220 may generate a data stream by merging the processed data signals (DS_OUT1 to DS_OUT4), and output the generated data stream.

Figure 3:
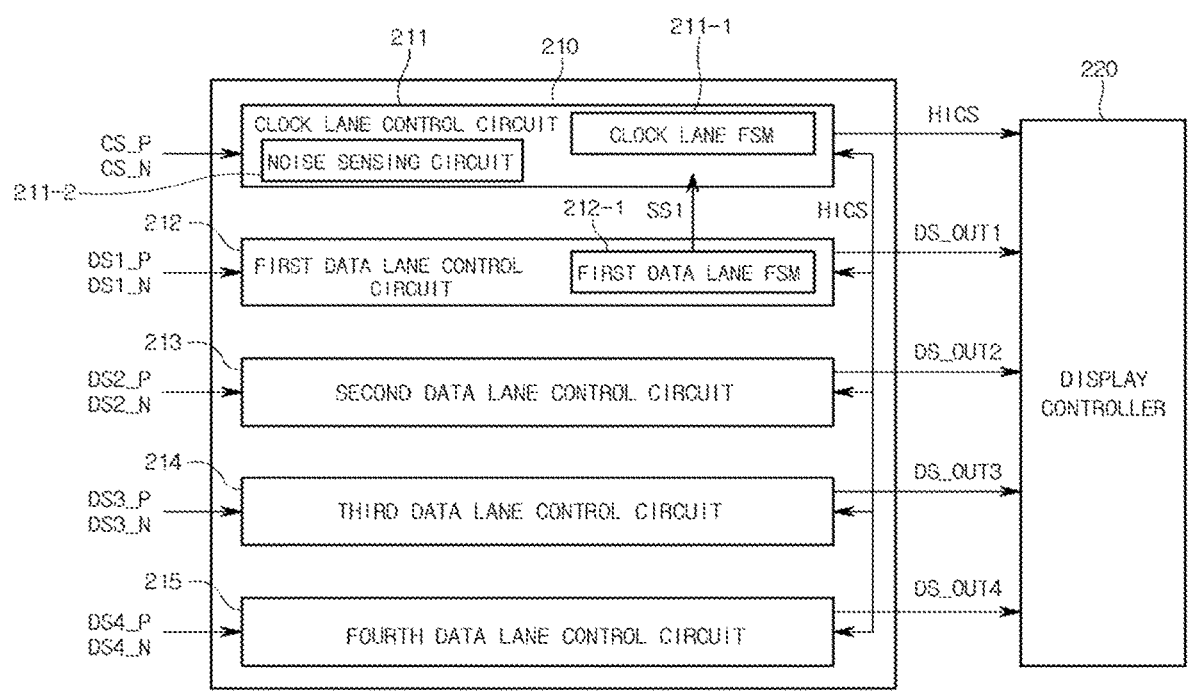
FIG. 3 is a diagram illustrating an example of a reception apparatus in accordance with one or more embodiments.

When the data lanes (DATA1 to DATA4) are operated in the high-speed mode, the display controller 220 may generate the data stream by using the high-speed internal clock signal (HICS) output from the clock lane control circuit 211 (FIG. 3).

The display 300 may include a panel circuit 310 and a display panel 320.

The panel circuit 310 may convert the display data into a form suitable for the display panel 320.

The display panel 320 may display an image corresponding to the display data received through the panel circuit 310.

The MIPI interface 230, that is connected between the host 100 and the driver IC 200, may include one clock lane (CLK) and one or more data lanes (DATA1 to DATAn). According to the examples, the transmission system 10 may be implemented by one clock lane (CLK) for transmitting the clock signals (CS_P and CS_N). However, this is only an example, and separate transmission lines may be used to transmit the CS_P and CS_N clock signals. The transmission system 10 may also be implemented with at least one data lane (e.g., DATA1) for transmitting the data signals. For example, the transmission system 10 may use the mobile industry processor interface (MIPI) interface, but is not limited thereto. Hereinafter, for convenience of explanation, the disclosure will assume that the transmission system 10 includes one clock lane (CLK) and four data lanes (DATA1 to DATA4).

The disclosure refers to the specification provided by the MIPI alliance as a reference.

The clock lane (CLK) may be used to transmit the clock signals (CS_P and CS_N; collectively CS). The clock signals (CS_P and CS_N) can constitute a differential clock signal. According to the examples, the clock lane (CLK) may include two transmission lines, and each of the clock signals (CS_P and CS_N) can be transmitted through the respective transmission lines.

The data lanes (DATA1 to DATA4) may be used to transmit the respective data signals. That is, the first data lane (DATA1) may be used to transmit the first data signals (DS1_P and DS1_N; collectively DS1), the second data lane (DATA2) can be used to transmit the second data signals (DS2_P and DS2_N; collectively DS2), the third data lane (DATA3) can be used to transmit the third data signals (DS3_P and DS3_N; collectively DS3), and the fourth data lane (DATA4) can be used to transmit the fourth data signals (DS4_P and DS4_N; collectively DS4). Each pair of data signals ((DS1_P and DS1_N), (DS2_P and DS2_N), (DS3_P and DS3_N), and (DS4_P and DS4_N)) may constitute different differential data signals. According to the examples, each of the data lanes (DATA1 to DATA4) may include two transmission lines, and each of the data signals (DS1 to DS4) may be transmitted through each transmission line.

In the communication between the transmission apparatus 110 and the reception apparatus 210, each of the clock lane (CLK) and the data lanes (DATA1 to DATA4) can operate, respectively, according to any one mode of the first mode and the second mode. According to the examples, the operation speed in the first mode may be slower than the operation speed in the second mode. For example, the first mode may mean a low-power mode, and the second mode can mean a high-speed mode.

The low-power mode may be used to transmit the one-shot instruction. According to the examples, in the low-power mode, the signal can be transmitted as a single output signal to each of two lines included in each lane, and this transmission scheme may be referred to as a single ended transmission. In the low-power mode, the clock signal may be embedded in the data signal.

The high-speed mode may be used to transmit data. According to the examples, in the high-speed mode, the signal can be transmitted as a differential signal through two lines included in each lane.

The voltage of the signal transmitted through each lane (CLK and DATA1 to DATA4) may be relatively higher (compared to the high-speed mode) in the low-power mode, while the rate of the signal may be relatively low in the low-power mode.

According to the examples, the mode switching (or transition) of lanes may be made according to a level change of signals transmitted through lanes by the host 100 or the transmission apparatus 110, and the reception apparatus 210 can determine the mode switching of the lanes based on the level change.

Figure 2:
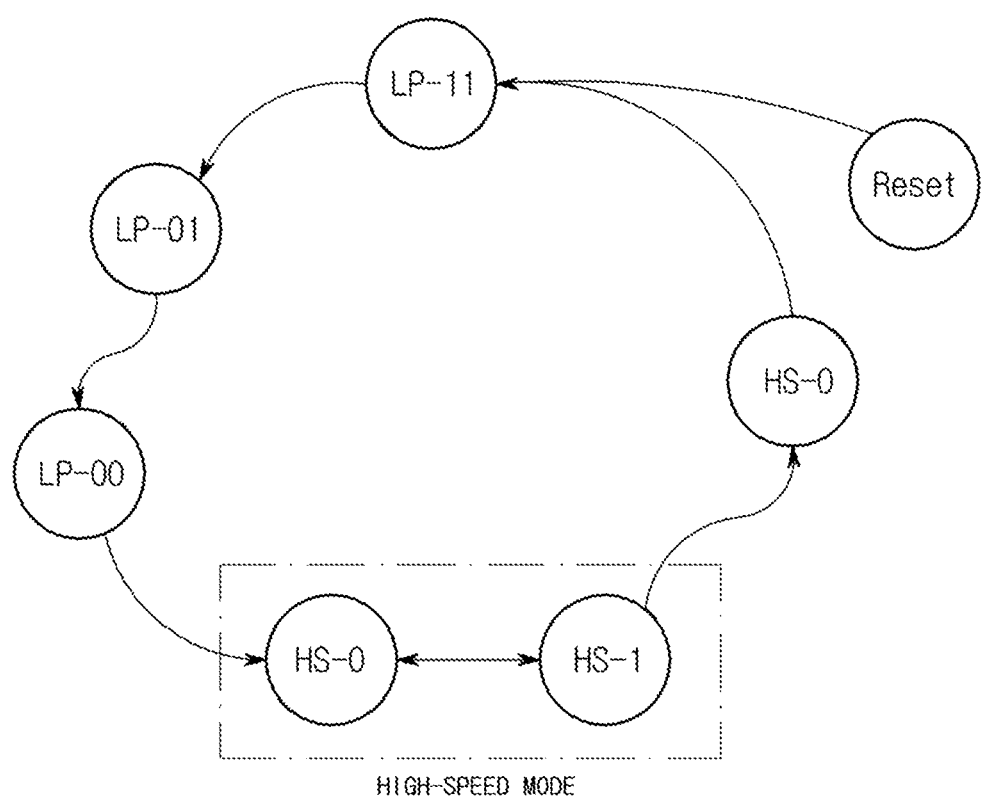
FIG. 2 is a state diagram illustrating an example of the mode switching on a general MIPI interface in accordance with one or more embodiments.

FIG. 2 is a state diagram illustrating an example of the mode switching on a general MIPI interface. The state diagram shown in FIG. 2 can be applied to both the clock lane (CLK) and the data lanes (DATA1 to DATA4). Additionally, each state (LP-11, LP-01, LP-00, HS-0, and HS-1) shown in FIG. 2 may be distinguished by the voltage level of the signal.

Referring to FIG. 2, each of the lanes (CLK and DATA1 to DATA4) may be initially placed in the LP-11 state. The LP-11 state means a stop state. Thereafter, the transmission apparatus 110 may drive a specific sequence (e.g., a high-speed mode entering sequence) for entering the high-speed mode in order to transmit data to the reception apparatus 210. That is, the transmission apparatus 110 changes the level of the signal (CS or DS) according to the high-speed mode entering sequence (sequence driving), and the reception apparatus 210 monitors the level of the signal (CS or DS) to recognize the high-speed mode entering sequence for entering the high-speed mode through the change in the level of the signal (CS or DS), changes the state of each of the lanes (CLK and DATA1 to DATA4) according to the high-speed mode entering sequence in a predetermined order (e.g., in the order of the LP-11, LP-01, and LP-00), and enters the high-speed mode (HS-0 or HS-1). For example, each of the lanes (CLK and DATA1 to DATA4) may pass through a high-speed mode request state (e.g., LP-01) and a high-speed mode ready state (e.g., LP-00) from a stop state (e.g., LP-11), and then enter the high-speed mode (e.g., HS-0). After entering the high-speed mode, the transmission apparatus 110 and the reception apparatus 210 may communicate data according to the high-speed mode. Thereafter, after the data communication is terminated, each of the lanes (CLK and DATA1 to DATA4) may enter the LP-11 state. The stop state, the high-speed mode request state, and the high-speed mode ready state are included in the low-power mode.

In order to properly process the data transmitted through the data lanes (DATA1 to DATA4) in the high-speed mode, the entry of the clock lane (CLK) into the high-speed mode should be faster than the entry of the data lanes (DATA1 to DATA4) into the high-speed mode, and the holding time of the high-speed mode of the clock lane (CLK) should be longer than the holding time of the high-speed mode of the data lanes (DATA1 to DATA4). That is, the clock lane (CLK) should be switched to the high-speed mode faster than the data lanes (DATA1 to DATA4) and switched to the low-speed mode later than the data lanes (DATA1 to DATA4).

FIG. 3 is a diagram illustrating an example of a reception apparatus according to an example. Referring to FIGS. 1 to 3, the reception apparatus 210 may include a clock lane control circuit 211 corresponding to the clock lane (CLK) and the data lane control circuits 212 to 215 corresponding to each of the data lanes (DATA1 to DATA4).

The clock lane control circuit 211 can receive the clock signal (CS), and determine the mode of the clock lane (CLK) by using the clock signals (CS_P and CS_N). According to the examples, the clock lane control circuit 211 can monitor the voltage level of the clock signals (CS_P and CS_N), and determine the mode of the clock lane (CLK) based on a result of the monitoring. For example, the clock lane control circuit 211 may determine whether the operation mode of the clock lane (CLK) is switched from the low-power mode to the high-speed mode, or whether the operation mode of the clock lane (CLK) is switched from the high-speed mode to the low-power mode. As described above, the clock lane control circuit 211 may determine the operation mode of the clock lane (CLK) by recognizing the sequence represented by the voltage levels of the clock signals (CS_P and CS_N).

According to the examples, the clock lane control circuit 211 may include a clock lane finite state machine (FSM) 211-1. The clock lane FSM 211-1 may determine the operation mode of the clock lane (CLK) according to the voltage levels of the clock signals (CS_P and CS_N) transmitted through the clock lane (CLK), and set the operation mode of the clock lane (CLK) according to the high-speed mode entering sequence.

The clock lane control circuit 211 may generate the internal clock signal based on the clock signals (CS_P and CS_N) according to the operation mode of the clock lane (CLK). When the clock lane (CLK) operates in the low-power mode, the clock lane control circuit 211 can generate a low-power internal clock signal from the clock signals (CS_P and CS_N), and operate by using the generated low-power internal clock signal. When the clock lane (CLK) operates in the high-speed mode, the clock lane control circuit 211 can generate a high-speed internal clock signal (HICS) from the clock signals (CS_P and CS_N), and output the generated high-speed internal clock signal (HICS) to the data lane control circuits 212 to 215 and the display controller 220. For example, the high-speed internal clock signal (HICS) can be synchronized with the clock signals (CS_P and CS_N).

The data lane control circuits 212 to 215 may receive the data signals transmitted through the corresponding data lanes, and determine the operation mode of the corresponding data lane by using the data signals. In addition, the data lane control circuits 212 to 215 may process the data signals, and transmit the processed data signals to the display controller 220.

Since the operation of each of the data lane control circuits 212 to 215 is the same, only the first data lane control circuit 212 will be described below, and the description of the remaining data lane control circuits 213 to 215 will be replaced with the description of the first data lane control circuit 212.

The first data lane control circuit 212 may monitor the voltage levels of the first data signals (DS1_P and DS1_N), and determine the operation mode of the first data lane (DATA1) according to a result of the monitoring. For example, the first data lane control circuit 212 can compare the voltage levels of the first data signals (DS1_P and DS1_N) with a predetermined threshold, and determine the operation mode of the first data lane (DATA1) according to the comparison result.

According to the examples, the first data lane control circuit 212 may determine the operation mode of the first data lane (DATA1) by recognizing the sequence represented by the voltage levels of the first data signals (DS1_P and DS1_N). For example, the first data lane control circuit 212 can determine whether the operation mode of the first data lane (DATA1) is the low-power mode, the high-speed mode, is switched from the low-power mode to the high-speed mode, or switched from the high-speed mode to the low-power mode. Additionally, the first data lane control circuit 212 may transmit a first state signal (SS1) indicating the operation mode of the first data lane (DATA1) or the switching of the operation mode to the clock lane control circuit 211.

According to the examples, the first data lane control circuit 212 may include a first data lane FSM 212-1. The first data lane FSM 212-1 may determine the operation mode of the first data lane (DATA1) according to the voltage levels of the data signals (DS1_P and DS1_N) transmitted through the first data lane (DATA1), and set the operation mode of the first data lane (DATA1) according to the high-speed mode entering sequence.

According to the examples, the remaining data lane control circuits 213 to 215 may also include the respective corresponding data lane FSMs, but are not limited thereto, and the first data lane FSM 212-1 may determine or set the operation modes of the remaining data lanes (DATA2 to DATA4). Hereinafter, for convenience, it may be assumed that the first data lane FSM 212-1 can determine or set at least one operation mode of the data lanes (DATA1 to DATA4).

According to the examples, the first data lane FSM 212-1 may generate the first state signal (SS1) indicating the states of the data lanes (DATA1 to DATA4), and transmit the generated first state signal (SS1) to the clock lane FSM 211-1. The clock lane FSM 211-1 can determine the operation modes of the data lanes (DATA1 to DATA4) according to the transmitted first state signal (SS1), and switch (or set) the operation mode of the clock lane (CLK) according to the determination result.

Hereinafter, it may be assumed that the setting or switching of the operation modes of the lanes (CLK and DATA1 to DATA4) discussed in the examples is performed according to the control of the lane FSM corresponding to each of the lanes (CLK and DATA1 to DATA4).

The first data lane control circuit 212 may operate according to the operation mode of the first data lane (DATA1).

When the first data lane (DATA1) operates in the low-power mode, the first data lane control circuit 212 can generate the low-power internal clock signal from the first data signals (DS1_P and DS1_N), process the first data signals (DS1_P and DS1_N) by using the generated low-power internal clock signal, and output the first processed data signal (DS_OUT1). According to the examples, the first data lane control circuit 212 can generate the first processed data signal (DS_OUT1) by serial-to-parallel converting the first data signals (DS1_P and DS1_N) based on the generated low-power internal clock signal.

When the first data lane (DATA1) operates in the high-speed mode, the first data lane control circuit 212 can process the first data signals (DS1_P and DS1_N) by using the high-speed internal clock signal (HICS) transmitted from the clock lane control circuit 211, and output the first processed data signal (DS_OUT1).

According to the above-described process, the remaining data lane control circuits 213 to 215 may also output the processed data signals (DS_OUT2 to DS_OUT4) to the display controller 220.

The clock lane control circuit 211 and the data lane control circuits 212 to 215 can be referred to as the physical layer (PHY) of the MIPI interface 230.

Figure 4:
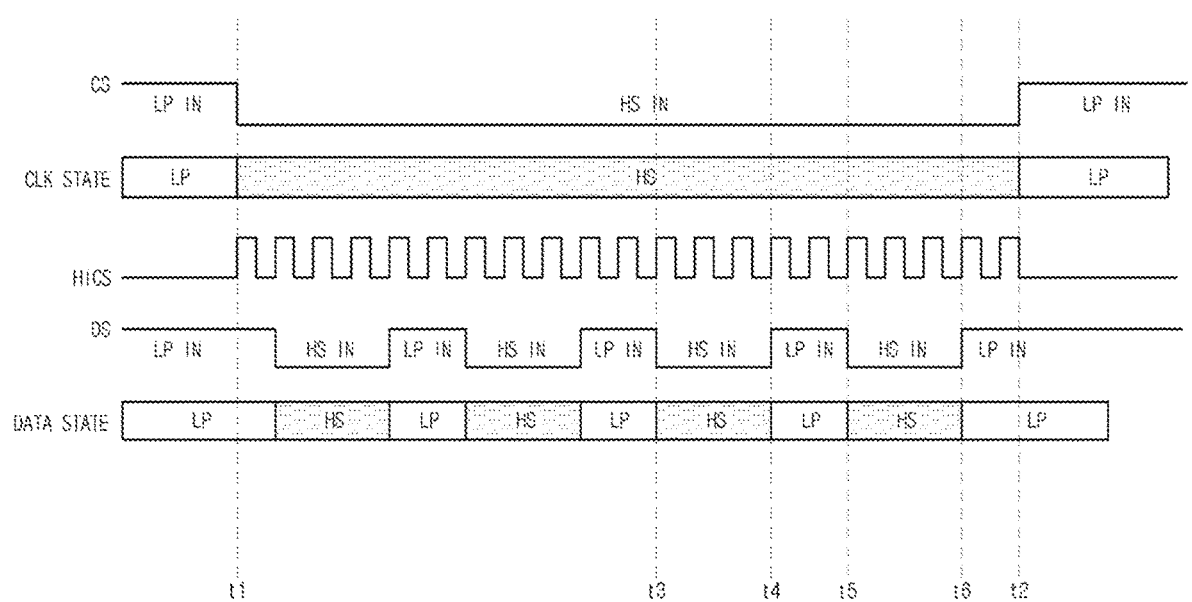
FIG. 4 illustrates an example of a timing diagram showing the general operation of the reception apparatus in accordance with one or more embodiments.

FIG. 4 is a timing diagram illustrating the general operation of the reception apparatus according to the examples. Meanwhile, the reference numeral "LP IN" shown in FIG. 4 indicates the signal (DS or CS) in the low-power mode, and the reference numeral "HS IN" indicates the signal (DS or CS) in the high-speed mode. Referring to FIG. 4, before the time $t_1$, the clock lane (CLK) can operate in the low-power mode (LP). Thereafter, at the time $t_1$, the clock lane (CLK) is switched from the low-power mode (LP) to the high-speed mode (HS), and then the data lanes (DATA1 to DATA4) are also switched to the high-speed mode (HS). The clock lane control circuit 211 generates and outputs the high-speed internal clock signal (HICS) after the time $t_1$. Thereafter, the data lane control circuits 212 to 215 can process the data signal (DS) input in the high-speed mode (HS) by using the high-speed internal clock signal (HICS). Then, the clock lane (CLK) is normally switched from the high-speed mode (HS) to the low-power mode (LP) at the time $t_2$, and thereafter, the data lanes (DATA1 to DATA4) are also switched to the low-power mode (LP).

Figure 5:
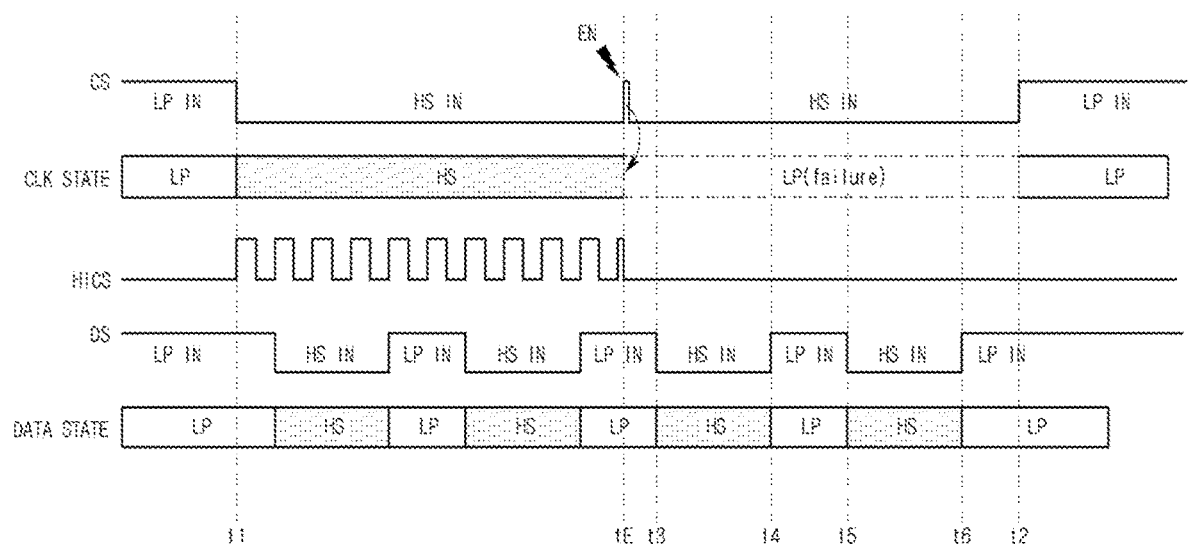
FIG. 5 is an example of a timing diagram illustrating the effects of the occurrence of noise.

FIG. 5 is an example of a timing diagram illustrating the effects of the occurrence of noise.

Referring to FIGS. 1 to 5, as in FIG. 4, the clock lane (CLK) is switched from the low-power mode (LP) to the high-speed mode (HS) at the time $t_1$. However, unlike FIG. 4, an external noise (EN) occurs when the operation modes of the data lanes (DATA1 to DATA4) are the low-power mode (LP) at the time $t_E$ and the clock lane (CLK) is switched from the high-speed mode (HS) to the low-power mode (LP) by the external noise (EN) (clock failure or clock malfunction). This clock failure is caused not by the sequence driven by the transmission apparatus 110 but accidentally by the external noise (EN).

Specifically, as described above, the voltage level of the data transmitted in the high-speed mode (HS) may be lower than the voltage level of the data transmitted in the low-power mode (LP). When the external noise (EN) occurs, the voltage level transmitted through the lanes may be increased by the external noise (EN), and therefore, the operation mode of each lane may be switched (or collapsed) from the high-speed mode (HS) to the low-power mode (LP) according to the voltage level increased by the external noise (EN).

Generally, when transmitting the data requiring processing (e.g., image data, etc.), the host 100 or the transmission apparatus 110 transmits the data through the lanes in the high-speed mode (HS), and may not perform the switching (or setting) for the operation mode before the transmission of the data is completed. Therefore, when the operation mode of each lane is switched to the low-power mode (LP) as the voltage level of the data transmitted through the lanes is accidentally changed by the external noise (EN), the operation mode of the lanes is kept in the low-power mode (LP) until the transmission of the data requiring the next processing starts, and as a result, all the data requiring the processing after the external noise (EN) has occurred cannot be processed, thereby occurring large data loss.

That is, as the clock lane (CLK) is switched to the low-power mode (LP) at the time $t_E$, the clock lane control circuit 211 cannot generate the high-speed internal clock signal (HICS) subsequent to the time $t_E$, and as a result, the data signal (DS) input in the high-speed mode (HS) after the time $t_E$ cannot be processed. In this example, the data signal (DS) input in the high-speed mode (HS) cannot be processed by the data lane control circuits 212 to 215 until the clock lane (CLK) is switched back to the high-speed mode (HS) to generate the high-speed internal clock signal (HICS), thereby occurring the data loss. For example, the data signal (DS) transmitted after the time $t_E$ cannot be processed by the reception apparatus 210.

Figure 6:
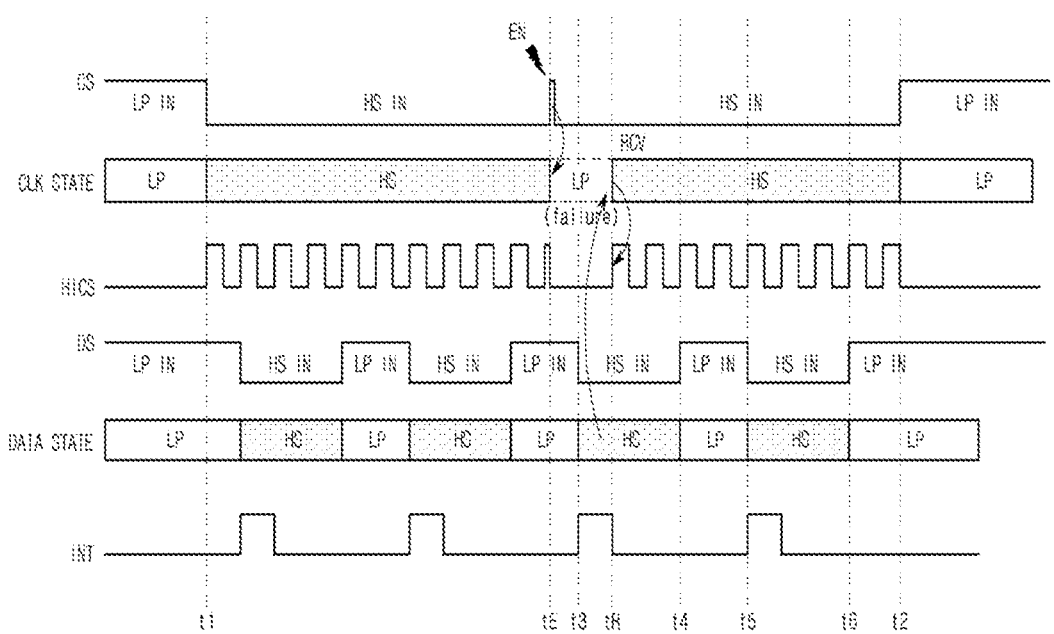
FIG. 6 is an example of a timing diagram illustrating the operation of the reception apparatus based on the occurrence of noise in accordance with one or more embodiments.

FIG. 6 is an example of a timing diagram illustrating the operation of the reception apparatus upon occurrence of noise.

Referring to FIGS. 1 to 6, as in FIG. 5, the external noise (EN) occurs at the time $t_E$, and as a result, the operation mode of the clock lane (CLK) is switched from the high-speed mode (HS) to the low-power mode (LP). However, the reception apparatus according to the embodiments of the present disclosure can recover the clock failure due to the external noise (EN). The details thereof will be described below.

The clock lane control circuit 211 can determine whether the operation modes of the data lanes (DATA1 to DATA4) are the high-speed mode (HS) based on the state signals (e.g., the first state signal (SS1)) output from the data lane control circuits 212 to 215. For example, the clock lane control circuit 211 can determine whether the operation modes of the data lanes (DATA1 to DATA4) have been switched from the low-power mode (LP) to the high-speed mode (HS).

The clock lane control circuit 211 may keep the operation mode of the clock lane (CLK) in the high-speed mode (HS), when the operation modes of the data lanes (DATA1 to DATA4) are the high-speed mode (HS). According to the examples, the clock lane control circuit 211 may keep the operation mode of the clock lane (CLK) in the high-speed mode (HS), when the operation modes of the data lanes (DATA1 to DATA4) are sensed as the high-speed mode (HS) or switched from the low-power mode (LP) to the high-speed mode (HS).

In order to prevent the unnecessary operation, when the operation modes of the data lanes (DATA1 to DATA4) are the high-speed mode (HS), the clock lane control circuit 211 may keep the existing high-speed mode (HS) if the operation mode of the clock lane (CLK) is the high-speed mode (HS), and the clock lane control circuit 211 may switch the operation mode to the high-speed mode (HS) if the operation mode of the clock lane (CLK) is the low-power mode (LP).

For example, the clock lane control circuit 211 may set the operation mode of the clock lane (CLK) to the high-speed mode (HS), and generate the high-speed internal clock signal (HICS), when the operation modes of the data lanes (DATA1 to DATA4) are the high-speed mode (HS).

The reception apparatus according to the examples can quickly recover the clock failure caused by the external noise (EN). The reception apparatus 210 according to the embodiments of the present disclosure can forcibly keep the operation state of the clock lane (CLK) in the high-speed mode (HS), when the operation state of the data lane (DATA) is switched from the low-power mode (LP) to the high-speed mode (HS).

According to the examples, the clock lane control circuit 211 can set the operation mode of the clock lane (CLK) to the high-speed mode (HS) without the sequence for entering the high-speed mode (HS) driven by the transmission apparatus 110, when the operation modes of the data lanes (DATA1 to DATA4) are the high-speed mode (HS).

As described above, in order to set the operation mode of the clock lane (CLK) from the low-power mode (LP) to the high-speed mode (HS) in a general situation, the high-speed mode entering sequence may be needed, and the clock lane (CLK) may pass through the high-speed mode request state (e.g., LP-01) and the high-speed mode ready state (e.g., LP-00) from the stop state (e.g., LP-11) and may then be switched to the high-speed mode (HS). However, according to the examples, in order to overcome the clock failure, the clock lane control circuit 211 may set the operation mode of the clock lane (CLK) to the high-speed mode (HS) even without the high-speed mode entering sequence, when the operation modes of the data lanes (DATA1 to DATA4) are the high-speed mode (HS), and as a result, the operation mode (or state) of the clock lane (CLK) cannot pass through the high-speed mode request state (e.g., LP-01) and the high-speed mode ready state (e.g., LP-00), and can be directly switched to the high-speed mode (HS). Since the operation mode of the clock lane (CLK) is the high-speed mode (HS), the clock lane control circuit 211 may generate the high-speed internal clock signal (HICS) again (clock recovery; RCV), and the data lane control circuits 212 to 215 can process the data signal (DS) by using the recovered high-speed internal clock signal (HICS).

According to the examples, the clock lane control circuit 211 can set the operation mode of the clock lane (CLK) to the high-speed mode (HS) in response to an interrupt signal (INT) generated when the operation modes of the data lanes (DATA1 to DATA4) are the high-speed mode (HS). The interrupt signal (INT) can be a state signal (e.g., the first state signal (SS1)) generated by the data lane control circuits 212 to 215. Alternatively, the interrupt signal (INT) can be a signal generated by the clock lane control circuit 211 in response to the state signal.

The clock lane control circuit 211 may sense the interrupt signal (INT), and automatically set the operation mode of the clock lane (CLK) to the high-speed mode (HS) when the interrupt signal (INT) has been sensed. For example, the clock lane control circuit 211 can set the operation mode of the clock lane (CLK) to the high-speed mode (HS) according to the interrupt signal (INT) generated while the data lanes (DATA1 to DATA4) operate according to the high-speed mode.

In FIG. 6, after the time $t_E$ at which the external noise (EN) has occurred, the operation state of the data lane (DATA) is switched from the low-power mode (LP) to the high-speed mode (HS) at the time $t_3$, and at this time, the clock lane control circuit 211 can determine that the operation state of the data lane (DATA) has been switched from the low-power mode (LP) to the high-speed mode (HS). At the time $t_3$, the interrupt signal (INT) is generated when the operation state of the data lane (DATA) has been switched from the low-power mode (LP) to the high-speed mode (HS). After the time $t_3$, the clock lane control circuit 211 can set the operation mode of the clock lane (CLK) to the high-speed mode (HS) in response to the interrupt signal (INT), and generate the high-speed internal clock signal (HICS). Meanwhile, FIG. 6 shows that the time $t_R$ at which the operation mode of the clock lane (CLK) is switched to the high-speed mode (HS) is after the time $t_3$ at which the interrupt signal (INT) is generated, but according to the examples, the time $t_R$ may be equal to or later than the time $t_3$ ($t_R \geq t_3$). That is, the clock lane control circuit 211 can switch the operation mode of the clock lane (CLK) to the high-speed mode (HS) when the interrupt signal (INT) is enabled (i.e., the times $t_3$ to $t_R$).

Therefore, although the operation mode of the clock lane (CLK) has been switched to the low-power mode (LP) by the external noise (EN) at the time $t_E$, then the operation mode of the clock lane (CLK) has been recovered to the high-speed mode (HS) by the clock lane control circuit 211 (after the time $t_R$), such that the data lane control circuits 212 to 215 can process the data signal (DS) transmitted after the time $t_R$ by using the high-speed internal clock signal (HICS), and as a result, the data loss is reduced.

According to the examples, the clock lane control circuit 211 can further include a noise sensing circuit 211-2 for measuring the external noise occurring on at least one of the lanes (CLK and DATA1 to DATA4). For example, when the noise is sensed by the noise sensing circuit 211-2, the clock lane control circuit 211 can determine whether the operation state of the data lane (DATA) is switched from the low-power mode (LP) to the high-speed mode (HS), set the operation mode of the clock lane (CLK) to the high-speed mode (HS), and generate the high-speed internal clock signal (HICS).

Figure 7:
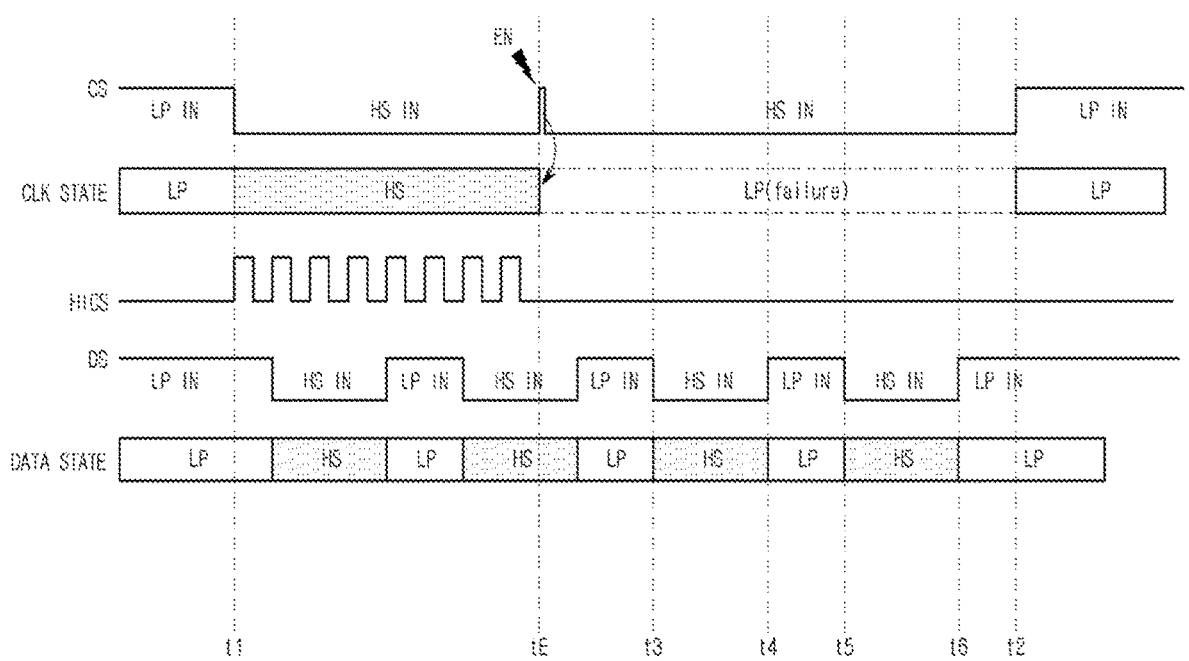
FIG. 7 is an example of a timing diagram illustrating the effects of the occurrence of noise.

FIG. 7 is an example of a timing diagram illustrating an example of an operation during the occurrence of noise.

Referring to FIGS. 1 to 7, unlike FIG. 5, FIG. 7 illustrates an example where the external noise (EN) occurs when the operation modes of the data lanes (DATA1 to DATA4) are the high-speed mode (HS). The remainder except for this is the same as in FIG. 5. That is, as the clock lane (CLK) is switched to the low-power mode (LP) at the time $t_E$ by the generated external noise (EN), the clock lane control circuit 211 no longer generates the high-speed internal clock signal (HICS) after the time $t_E$, and as a result, the data signal (DS) input in the high-speed mode (HS) after the time $t_E$, cannot be processed. In this example, the data signal (DS) transmitted in the high-speed mode after the time $t_E$ cannot be processed by the reception apparatus 210, thereby occurring the data loss.

Figure 8:
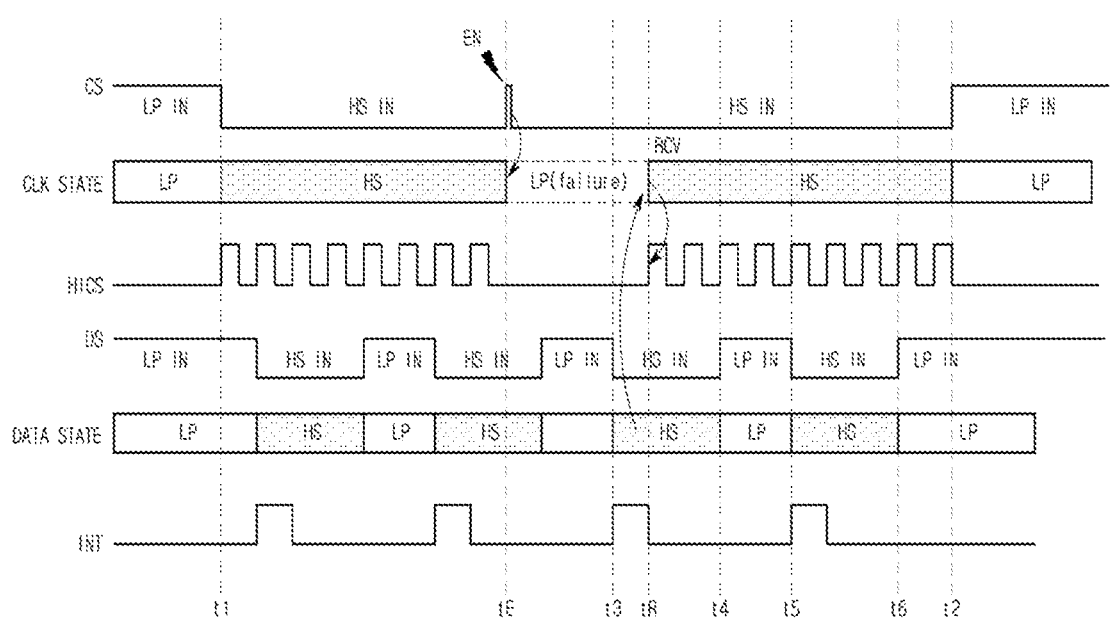
FIG. 8 is an example of a timing diagram illustrating the operation of the reception apparatus based on the occurrence of noise in accordance with one or more embodiments.

FIG. 8 is an example of a timing diagram illustrating the operation of the reception apparatus upon occurrence of noise.

Referring to FIGS. 1 to 8, the example reception apparatus can quickly recover the clock failure caused by the external noise (EN).

The external noise (EN) occurs at the time $t_E$ as in FIG. 7, and as a result, the operation mode of the clock lane (CLK) is switched from the high-speed mode (HS) to the low-power mode (LP). However, in an example, the reception apparatus may recover the clock failure due to the external noise (EN).

Except that the timing of occurrence of external noise (EN) is when the operation modes of the data lanes (DATA1 to DATA4) are the high-speed mode (HS), the operation (e.g., clock recovery operation) of the reception apparatus 210 or the clock lane control circuit 211 shown in FIG. 8 is substantially the same as the operation of the reception apparatus shown in FIG. 6.

As described above, the clock lane control circuit 211 can keep the operation mode of the clock lane (CLK) in the high-speed mode (HS), when the operation modes of the data lanes (DATA1 to DATA4) are the high-speed mode (HS). According to the examples, the clock lane control circuit 211 can keep the operation mode of the clock lane (CLK) in the high-speed mode (HS), when the operation modes of the data lanes (DATA1 to DATA4) are sensed as the high-speed mode (HS) or switched from the low-power mode (LP) to the high-speed mode (HS).

For example, when the operation modes of the data lanes (DATA1 to DATA4) have been switched from the low-power mode (LP) to the high-speed mode (HS), the clock lane control circuit 211 can set the operation mode of the clock lane (CLK) to the high-speed mode (HS), and generate the high-speed internal clock signal (HICS).

As explained in FIG. 6, the operation state of the data lane (DATA) can be switched from the low-power mode (LP) to the high-speed mode (HS) at the time $t_3$, and at this time, the clock lane control circuit 211 can determine that the operation state of the data lane (DATA) has been switched from the low-power mode (LP) to the high-speed mode (HS). At the time $t_3$, the interrupt signal (INT) is generated when the operation state of the data lane (DATA) has been switched from the low-power mode (LP) to the high-speed mode (HS). After the time $t_3$, the clock lane control circuit 211 can set the operation mode of the clock lane (CLK) to the high-speed mode (HS) in response to the interrupt signal (INT), and generate the high-speed internal clock signal (HICS).

Therefore, although the operation mode of the clock lane (CLK) has been switched to the low-power mode (LP) by the external noise (EN) at the time $t_E$, then the operation mode of the clock lane (CLK) has been recovered to the high-speed mode (HS) by the clock lane control circuit 211 (after the time $t_R$), such that the data lane control circuits 212 to 215 can process the data signal (DS) transmitted after the time $t_E$ by using the high-speed internal clock signal (HICS), and as a result, the data loss is reduced.

Figure 9:
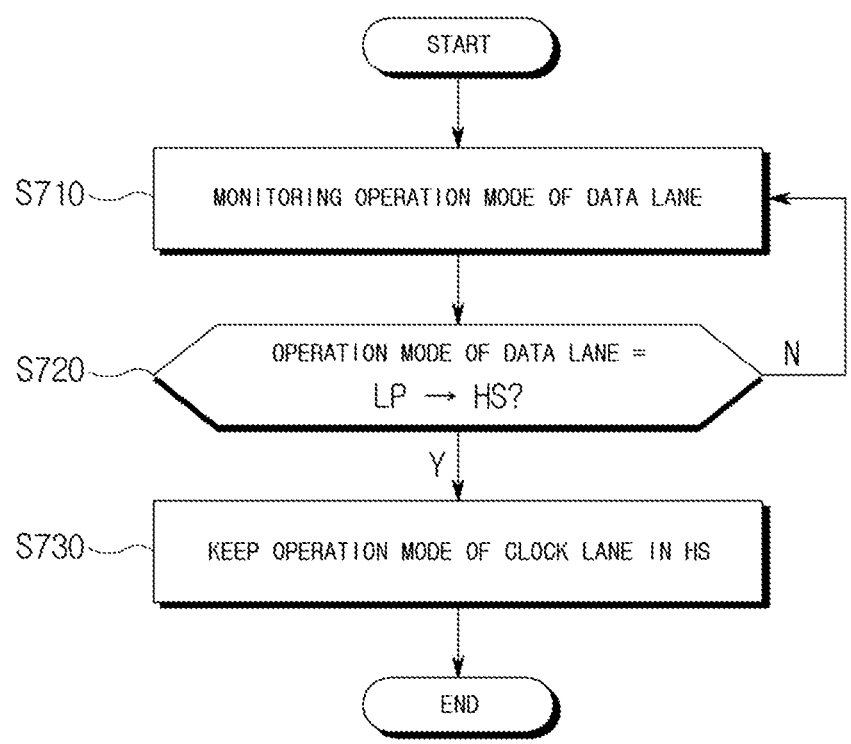
FIG. 9 is a flowchart illustrating an example of the operation of a reception apparatus in accordance with one or more embodiments.

FIG. 9 is a flowchart showing an example of the operation of the reception apparatus.

Referring to FIGS. 1 to 9, the reception apparatus 210 may monitor the operation modes of the data lanes (DATA1 to DATA4) in operation S710.

According to a result of the monitoring of the operation modes of the data lanes, the reception apparatus 210 may determine whether the operation modes of the data lanes (DATA1 to DATA4) are switched from the low-power mode (LP) to the high-speed mode (HS) S720.

When the operation modes of the data lanes (DATA1 to DATA4) are switched from the low-power mode (LP) to the high-speed mode (HS) (Y in operation S720), the reception apparatus 210 can keep (or set) the operation mode of the clock lane (CLK) to the high-speed mode (HS) in operation S730.

When the operation modes of the data lanes (DATA1 to DATA4) are not switched from the low-power mode (LP) to the high-speed mode (HS) (N in operation S720), the reception apparatus 210 may continuously monitor the operation modes of the data lanes (DATA1 to DATA4).

Figure 10:
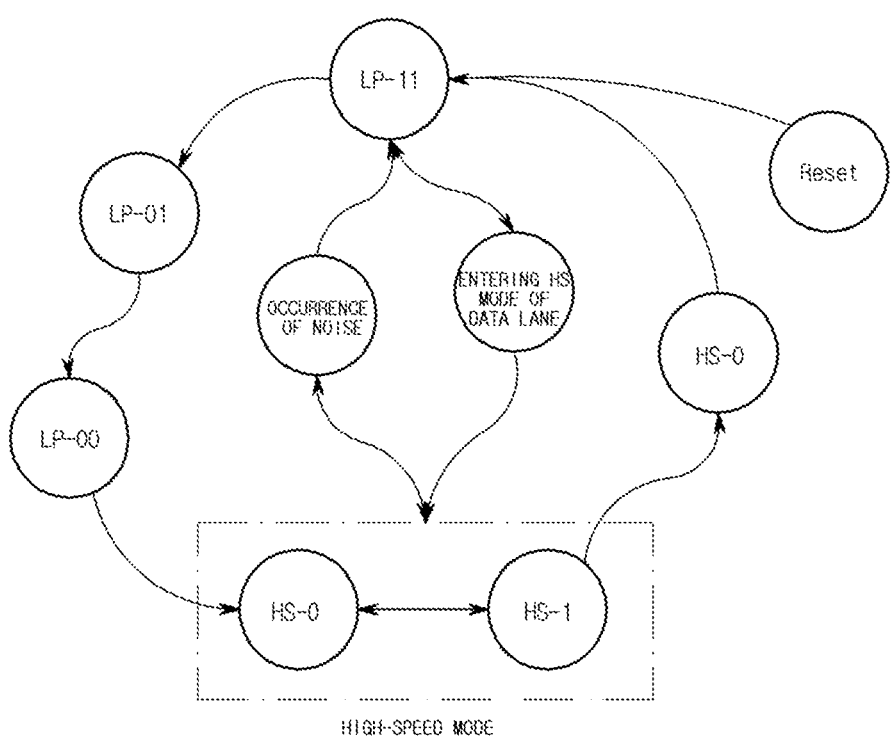
FIG. 10 is a state diagram illustrating an example of the mode switching of the transmission system in accordance with one or more embodiments.

FIG. 10 is an example of a state diagram illustrating the mode switching of the transmission system.

Referring to FIGS. 1 to 10, when the external noise occurs, the clock lane (CLK) operating in the high-speed mode (HS) may be switched to the low-power mode (LP or LP-11). This is unintended, and when the clock lane (CLK) is switched to the low-power mode (LP), the data signals on the data lane (DATA) transmitted in the high-speed mode (HS) cannot be processed and the data loss occurs. Furthermore, the high-speed mode entering sequence may be needed for the clock lane (CLK) to enter the high-speed mode again and may enter the high-speed mode (HS) (e.g., HS-0) only when passing through the high-speed mode request state (e.g., LP-01) and the high-speed mode ready state (e.g., LP-00) from the stop state (e.g., LP-11) according to the high-speed mode entering sequence.

However, when the operation modes of the data lanes (DATA1 to DATA4) are switched from the low-power mode (LP) to the high-speed mode (HS), the reception apparatus 210 according to the embodiments of the present disclosure can directly set the operation mode of the clock lane (CLK) from the low-power mode (LP) to the high-speed mode (HS) without the high-speed mode entering sequence, thereby reducing the data loss.

The host 100, driver IC 200, and display 300, with respect to FIGS. 1-10, and that perform operations described in this application are implemented as and by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods of FIGS. 1-10 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. The instructions or software may be written using any programming language based on the block diagrams and the flow charts illustrated in the drawings and the corresponding descriptions in the specification, which disclose algorithms for performing the operations performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A reception apparatus communicating with a transmission apparatus, the reception apparatus comprising:
a clock lane control circuit configured to determine an operation mode of a clock lane based on a clock signal transmitted through the clock lane, and perform an operation based on the determined operation mode of the clock lane; and
a data lane control circuit configured to determine an operation mode of a data lane based on a data signal transmitted from the transmission apparatus, and perform an operation based on the determined operation mode of the data lane,
wherein the clock lane control circuit is further configured to:
detect that the operation mode of the data lane has been switched from a low-power mode to a high-speed mode,
generate an interrupt signal based on a result of the detection, and
set the operation mode of the clock lane to the high-speed mode in response to the generated interrupt signal regardless of the operation mode of the clock lane.

2. The reception apparatus of claim 1, wherein the data lane control circuit is further configured to output a state signal indicating the operation mode of the data lane, and
wherein the clock lane control circuit is further configured to set the operation mode of the clock lane to the high-speed mode in response to the state signal.

3. The reception apparatus of claim 2, wherein the clock lane control circuit comprises a clock lane finite state machine (FSM) configured to control the operation mode of the clock lane, and
wherein the clock lane FSM is configured to:
switch the operation mode of the clock lane from the low-power mode to the high-speed mode, when a level of the clock signal indicates a high-speed mode entering sequence, and
set the operation mode of the clock lane to the high-speed mode when the operation mode of the data lane is switched from the low-power mode to the high-speed mode, when the level of the clock signal does not indicate the high-speed mode entering sequence.

4. The reception apparatus of claim 3, wherein the data lane control circuit comprises a data lane FSM configured to control the operation mode of the data lane, and
wherein the data lane FSM is configured to:
monitor a level of the data signal, and generate a state signal indicating the operation mode of the data lane according to a result of the monitoring, and
output the generated state signal to the clock lane FSM.

5. The reception apparatus of claim 1, wherein the clock lane control circuit is further configured to generate a high-speed internal clock signal corresponding to the high-speed mode, and
wherein the data lane control circuit is further configured to process the data signal by being synchronized to the high-speed internal clock signal, and generate the processed data signal.

6. The reception apparatus of claim 2, wherein the clock lane control circuit is configured to generate the interrupt signal in response to the state signal.

7. The reception apparatus of claim 6, wherein the clock lane control circuit is further configured to generate the interrupt signal while the data lane operates in the high-speed mode.

8. The reception apparatus of claim 1, wherein the clock lane control circuit comprises a noise sensing circuit configured to detect external noise occurring on the clock lane, and the clock lane control circuit is further configured to:
determine whether the operation mode of the data lane is switched from the low-power mode to the high-speed mode, when the external noise is detected by the noise sensing circuit, and set the operation mode of the clock lane to the high-speed mode, when the operation mode of the data lane is switched from the low-power mode to the high-speed mode.

9. A communication method between a reception apparatus and a transmission apparatus, the method comprising:
determining an operation mode of a clock lane based on a clock signal transmitted through the clock lane, and performing an operation based on the determined operation mode of the clock lane;
determining an operation mode of the data lane based on a data signal transmitted from the transmission apparatus, and performing an operation based on the determined operation mode of the data lane;
setting the operation mode of the clock lane to a high-speed mode based on an interrupt signal generated when the operation mode of the data lane is switched from a low-power mode to the high-speed mode regardless of the operation mode of the clock lane;
generating a high-speed internal clock signal corresponding to the high-speed mode when the clock lane operates in the high-speed mode; and
processing the data signal by being synchronized to the high-speed internal clock signal and generating the processed data signal.

10. The method of claim 9, wherein the setting the operation mode of the clock lane to the high-speed mode comprises:
generating a state signal indicating the operation mode of the data lane; and
setting the operation mode of the clock lane to the high-speed mode in response to the state signal.

11. The method of claim 10, wherein the operating method further comprises:
switching the operation mode of the clock lane from the low-power mode to the high-speed mode, when a level of the clock signal indicates a high-speed mode entering sequence; and
setting the operation mode of the clock lane to the high-speed mode when the operation mode of the data lane is switched from the low-power mode to the high-speed mode, when the level of the clock signal does not indicate the high-speed mode entering sequence.

12. The method of claim 9, wherein the setting the operation mode of the clock lane to the high-speed mode comprises:
detecting that the operation mode of the data lane is switched from the low-power mode to the high-speed mode;
generating the interrupt signal based on a result of the detection; and
setting the operation mode of the clock lane to the high-speed mode in response to the generated interrupt signal.

13. The method of claim 12, wherein the generating the interrupt signal comprises generating the interrupt signal while the data lane operates according to the high-speed mode.

14. The method of claim 9, wherein the setting the operation mode of the clock lane to the high-speed mode comprises:
detecting external noise occurring on the clock lane;
determining whether the operation mode of the data lane is switched from the low-power mode to the high-speed mode, when the external noise has been detected; and setting the operation mode of the clock lane to the high-speed mode, when the operation mode of the data lane is switched to the high-speed mode.

15. A transmission system, comprising:
a transmission apparatus;
a reception apparatus; and
a clock lane and at least one data lane connected between the transmission apparatus and the reception apparatus,
wherein the clock lane and the at least one data lane are configured to operate based on any one mode of a low-power mode and a high-speed mode, respectively,
wherein the reception apparatus comprises:
a clock lane control circuit configured to determine an operation mode of the clock lane based on a clock signal transmitted through the clock lane, and perform an operation based on the determined operation mode of the clock lane; and
a data lane control circuit configured to:
determine the operation mode of the at least one data lane based on a data signal transmitted from the transmission apparatus,
output a state signal indicating the operation mode of the data lane, and
perform an operation based on the determined operation mode of the at least one data lane, and
wherein the clock lane control circuit is further configured to:
determine whether the operation mode of the data lane has been switched from the low-power mode to the high-speed mode based on the state signal, and
set the operation mode of the clock lane to the high-speed mode based on a result of the determining regardless of the operation of the mode of the clock lane.

16. The transmission system of claim 15, wherein the clock lane control circuit is configured to generate an interrupt signal in response to the state signal.

17. The transmission system of claim 16, wherein the clock lane control circuit comprises a clock lane finite state machine (FSM) configured to control the operation mode of the clock lane,
wherein the data lane control circuit comprises a data lane FSM for controlling the operation mode of the data lane,
wherein the data lane FSM is configured to:
monitor a level of the data signal, generate a state signal indicating the operation mode of the data lane based on a result of the monitoring, and output the generated state signal to the clock lane FSM, and
wherein the clock lane FSM is configured to:
set the operation mode of the clock lane to the high-speed mode in response to the state signal.

18. The transmission system of claim 15, wherein the clock lane control circuit is configured to:
detect that the operation mode of the data lane is switched from the low-power mode to the high-speed mode,
generate an interrupt signal according to a result of the detection, and
set the operation mode of the clock lane to the high-speed mode in response to the generated interrupt signal.

19. The transmission system of claim 16, wherein the clock lane control circuit comprises a noise sensing circuit configured to detect external noise occurring on the clock lane, and the clock lane control circuit is further configured to:

determine whether the operation mode of the data lane is switched from the low-power mode to the high-speed mode, when the external noise is detected by the noise sensing circuit, and set the operation mode of the clock lane to the high-speed mode, when the operation mode of the data lane is switched from the low-power mode to the high-speed mode.

20. A transmission system comprising:

an interface comprising:
   a transmission apparatus; and
   a reception apparatus; and
a clock lane and one or more data lanes configured to operate in one of a first mode and a second mode;
wherein the reception apparatus comprises a clock lane control circuit comprising a noise sensing circuit configured to detect external noise occurring on the clock lane, and
wherein the clock lane control circuit is configured to:
   determine whether an operation mode of the one or more data lanes has been switched from the first mode to the second mode, when the external noise is detected by the noise sensing circuit, and
set the operation mode of the clock lane to the second mode when the operation mode of the one or more data lanes is switched from the first mode to the second mode regardless of the operation mode of the clock lane.

21. The system of claim 20, wherein the first mode is a low-power mode and the second mode is a high-speed mode.

* * * * *